(12) United States Patent
Bondestram et al.

(10) Patent No.: US 7,063,981 B2
(45) Date of Patent: Jun. 20, 2006

(54) ACTIVE PULSE MONITORING IN A CHEMICAL REACTOR

(75) Inventors: Niklas Bondestram, Helsinki (FI); Menso Hendriks, Bilthoven (NL)

(73) Assignee: ASM International N.V., Bilthoven (NL)

( * ) Notice: Subject to any disclaimer, the term of this patent is extended or adjusted under 35 U.S.C. 154(b) by 451 days.

(21) Appl. No.: 10/066,169

(22) Filed: Jan. 30, 2002

(65) Prior Publication Data

US 2003/0143747 A1 Jul. 31, 2003

(51) Int. Cl.
*G01N 33/00* (2006.01)
*C23C 16/455* (2006.01)

(52) U.S. Cl. ............ 436/34; 118/715; 118/723 R; 118/723 MP; 427/96.8; 427/248.1; 427/250; 427/255.23; 427/255.28; 427/569; 427/585; 422/62

(58) Field of Classification Search .......... 118/715, 118/723 R, 723 VE, 723 MP; 427/99, 248.1, 427/250, 585, 255.23, 255.28, 523, 569, 427/96.8; 436/34; 422/62
See application file for complete search history.

(56) References Cited

U.S. PATENT DOCUMENTS

| | | | |
|---|---|---|---|
| 4,479,845 A * | 10/1984 | Nisizawa et al. ......... 117/86 |
| 5,399,881 A * | 3/1995 | Bozovic et al. ......... 505/190 |
| 6,038,919 A | 3/2000 | Schmitt et al. | |
| 6,287,965 B1 * | 9/2001 | Kang et al. ........... 438/648 |
| 6,613,383 B1 * | 9/2003 | George et al. ......... 427/212 |
| 6,660,660 B1 * | 12/2003 | Haukka et al. ......... 438/778 |

OTHER PUBLICATIONS

Gruia, M. et al, Journal de Chimie Physique et de Physico-Chimie Biologique 1976, 73, 634-640, no month.*
Dean, J. W. et al, Industrial & Engineering Chemistry Research 1988, 27, 1754-1759, no month.*
Desai, N. S. et al, AIChE Symposium Series 1988, 84, 73-79, no month.*
Lang, X. S. et al, Canadian Journal of Chemical Engineering 1991, 69, 1121-1125, no month.*
Yu, M. L. et al, Materials Research Society Symposium Proceedings 1991, 204, 37-46, no month.*
Davies, J. P. et al, nalytical Chemistry 1993, 65, 3004-3009, no month.*

(Continued)

*Primary Examiner*—Arlen Soderquist
(74) *Attorney, Agent, or Firm*—Knobbe, Martens, Olson & Bear, LLP.

(57) ABSTRACT

A method and apparatus for determining changes in a supply system, designed to supply repeated pulses of a vapor phase reactant to a reaction chamber is disclosed. One embodiment involves providing the reactant source, and a gas conduit to connect the reactant source to the reaction chamber, a valve positioned in communication with the reactant source such that switching of the valve induces vapor phase reactant pulses from the reactant source to the reaction chamber and a sensor positioned in communication with the reactant source and configured to provide a signal indicative of a characteristic parameter of the reactant pulse as a function of time. A curve is derived from the signal and the shape of the curve is monitored to determine changes in the curve shape over time during subsequent pulses.

42 Claims, 8 Drawing Sheets

OTHER PUBLICATIONS

Aarik, J. et al, Journal of Crystal Growth 1996, 169, 496-502, no month.*

Chowdhury, A. I. Et al, Journal of Vacuum Science & Technology, B 1997, 15, 127-132, no month.*

Min, J.-S. et al, Japanese Journal of Applied Physics, Part 1 1998, 37, 4999-5004, no month.*

Zhou, N. et al, Proceedings of SPIE 1999, 3792, 58-72, no month.*

Dietz, N. et al, Materials Research Society Symposium Proceedings 2000, 591, 307-312, no month.*

Pedrow, P. D. et al, Materials Research Society Symposium Proceedings 2000, 600, 325-331, no month.*

Reath, M. et al, Proceedings—Institute of Environment Sciences 1993, 39TH(vol. 1), 119-123.*

Tedder, L. L. et al, Journal of Vacuum Science & Technology, A 1996, 14, 267-270.*

Gevelber, M. et al, Proceedings—Electrochemical Society 1996, 96-5, 157-162.*

Weerts, W. L. M. et al, Surface Science 1996, 367, 321-339.*

* cited by examiner

ACTIVE PULSE MONITORING IN A CHEMICAL REACTOR

BACKGROUND OF THE INVENTION

1. Field of the Invention

The present invention relates to chemical processes in which a processing chemical is supplied in the form of repeated pulses of a gas phase or vapor phase reactant. More particularly, the invention relates to chemical processes for producing a thin film on a substrate by subjecting the substrate to repeated pulses of gas or vapor-phase reactants.

2. Description of the Related Art

There are several vapor deposition methods for growing thin films on the surface of substrates. These methods include vacuum evaporation deposition, Molecular Beam Epitaxy (MBE), different variants of Chemical Vapor Deposition (CVD) (including low-pressure and organometallic CVD and plasma-enhanced CVD), and Atomic Layer Epitaxy (ALE), which is more recently referred to as Atomic Layer Deposition (ALD).

ALE or ALD is a deposition method that is based on the sequential introduction of precursor species (e.g., a first precursor and a second precursor) to a substrate, which is located within a reaction chamber. The growth mechanism relies on the adsorption of one precursor on active sites of the substrate. Conditions are such that no more than a monolayer forms in one pulse so that the process is self-terminating or saturative. For example, the first precursor can include ligands that remain on the adsorbed species, which prevents further adsorption. Temperatures are maintained above precursor condensation temperatures and below thermal decomposition temperatures such that the precursor chemisorbs on the substrate(s) largely intact. This initial step of adsorption is typically followed by a first evacuation or purging stage wherein the excess first precursor and possible reaction byproducts are removed from the reaction chamber. The second precursor is then introduced into the reaction chamber. The second precursor typically adsorbs and reacts with the adsorbed species, thereby producing the desired thin film. This growth terminates once the entire amount of the adsorbed first precursor has been consumed. The excess of second precursor and possible reaction byproducts are then removed by a second evacuation or purge stage. The cycle can be repeated so as to grow the film to a desired thickness. Cycles can also be more complex. For example, the cycles can include three or more reactant pulses separated by purge and/or evacuation steps.

ALE and ALD methods are described, for example, in Finnish patent publications 52,359 and 57,975 and in U.S. Pat. Nos. 4,058,430 and 4,389,973, which are herein incorporated by reference. Apparatuses suited to implement these methods are disclosed in, for example, U.S. Pat. No. 5,855,680, Finnish Patent No. 100409, Material Science Report 4(7) (1989), p. 261, and Tyhjiötekniikka (Finnish publication for vacuum techniques), ISBN 951-794-422-5, pp. 253–261, which are incorporated herein by reference. ASM Microchemistry Oy, Espoo, Finland, supplies such equipment for the ALD process under the trade name ALCVD™.

According to conventional techniques, such as those disclosed in FI Patent publication 57,975, the purging stages involve a protective gas pulse, which forms a diffusion barrier between precursor pulses and also sweeps away the excess precursors and the gaseous reaction products from the substrate. Valves typically control the pulsing of the precursors and the purge gas. The purge gas is typically an inert gas, for example, nitrogen.

In some ALD reactors, some or all of the precursors may be initially stored in a container in a liquid or solid state. Such reactors are disclosed in co-pending U.S. patent application Ser. No. 09/854,707, filed May 14, 2001, and Ser. No. 09/835,931, filed Apr. 16, 2001, which are hereby incorporated herein by reference. Within the container, the precursor is heated to convert the solid or liquid precursor to a gaseous or vapor state. Typically, a carrier gas is used to transport the vaporized precursor to the reactor. The carrier gas is usually an inert gas (e.g., nitrogen), which can be the same gas that is used for the purging stages.

One problem associated with such ALD reactors and other chemical processes that use solid or liquid precursors is that it is difficult to determine how much solid or liquid precursor is left in the container. For example, low pressure is often required to volatilize the solid or liquid and the precursor may be highly flammable, explosive, corrosive and/or toxic. As such, the container is usually isolated from the surroundings except for the gas inlet and outlet conduits during use. Conventional measuring devices positioned in the container can be damaged and/or are impractical. As such, the chemical process is typically allowed to continue until the supply of precursor is exhausted. Operating in this manner is generally undesirable because it allows the concentration of the precursor in the reactor to drop below an ideal concentration range when the source is about to become depleted. One solution is to calculate the rate of precursor removal. Based upon the calculation, the container can be changed before the precursor is expected to be exhausted. However, a safety margin is typically including in the calculation. This can result in unused precursor remaining in the container, such that refilling is performed prematurely and the reactor downtime is increased (i.e., the duration of reactor use between refilling is reduced).

Another method for determining how much solid or liquid precursor is left in a container is disclosed in U.S. Pat. No. 6,038,919. This method involves closing an outlet of the container to define a measurement volume. A metered amount of gas is delivered to the measurement volume, while the pressure in the measurement volume is monitored. The pressure is used to calculate the amount of precursor remaining in the container. This method also has several disadvantages. For example, it requires that the outlet of the container be closed, which increases the downtime of the reactor.

It is also possible for the various valves and conduits between the precursor container and the reactor to become damaged or worn out. This can result in contamination and CVD-type reactions between the precursors, thereby compromising the ALD process. Therefore, a need also exists for an improved method and apparatus for determining when the valves, conduits and connections in an ALD reactor are worn out or damaged, preferably before worn out or damaged parts lower the throughput of the reactor.

SUMMARY OF THE INVENTION

One aspect of the present invention involves a method for determining changes in a reactant supply system that is designed to supply repeated pulses of a vapor phase reactant to a reaction chamber. The method includes providing a reactant source, a gas conduit system connecting reactant source to the reaction chamber and a valve in the conduit system. A sensor also provides a signal indicative of a characteristic parameter of reactant pulses as a function of time. The valve is repeatedly switched to induce repeated vapor phase reactant pulses, and a curve is generated from the sensor signal, the curve having a shape for the repeated pulses. The shape of the curve is monitored to determine changes in the curve shape over time during subsequent pulses.

In an illustrated embodiment, the characteristic parameter is pressure. In another embodiment, the reactant source includes a solid or liquid phase of the reactant.

Another aspect of the present invention involves an apparatus for supplying repeated pulses of vapor phase reactants to a reaction chamber. The apparatus includes a conduit that connects the reactant source to the reaction chamber. The apparatus further includes a valve, and a control unit connected to said valve to switch the valve repeatedly such that repeated reactant pulses are created. A sensor is positioned to measure a characteristic parameter of the reactant pulses as a function of time, while a diagnostic and control unit is operatively connected to the sensor and configured to generate a curve of the characteristic parameter of a reactant pulse during repeated reactant pulses. The diagnostic and control unit monitors or enables monitoring the curve shape for detecting changes in the curve shape during subsequent reactant pulses.

Yet another aspect of the present invention is a method for determining changes in the supply of repeated vapor phase reactant pulses from a reactant source within an atomic layer deposition (ALD) system. The method includes monitoring a characteristic parameter in a conduit that communicates with a reactant source container in the ALD system. A pattern of the characteristic parameter is compared over time during at least one cycle to a pattern of the characteristic parameter over time during at least one subsequent ALD cycle.

It should be noted that certain objects and advantages of the invention have been described above for the purpose of describing the invention and the advantages achieved over the prior art. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

It should also be noted that all of these embodiments are intended to be within the scope of the invention herein disclosed. These and other embodiments of the present invention will become readily apparent to those skilled in the art from the following detailed description of the preferred embodiments having reference to the attached figures, the invention not being limited to any particular preferred embodiment(s) disclosed.

BRIEF DESCRIPTION OF THE DRAWINGS

In the following, the invention will be described in greater detail with the help of exemplifying embodiments illustrated in the appended drawings, in which like reference numbers are employed for similar features in different embodiments and, in which.

DETAILED DESCRIPTION OF THE PREFERRED EMBODIMENT

Figure 1:
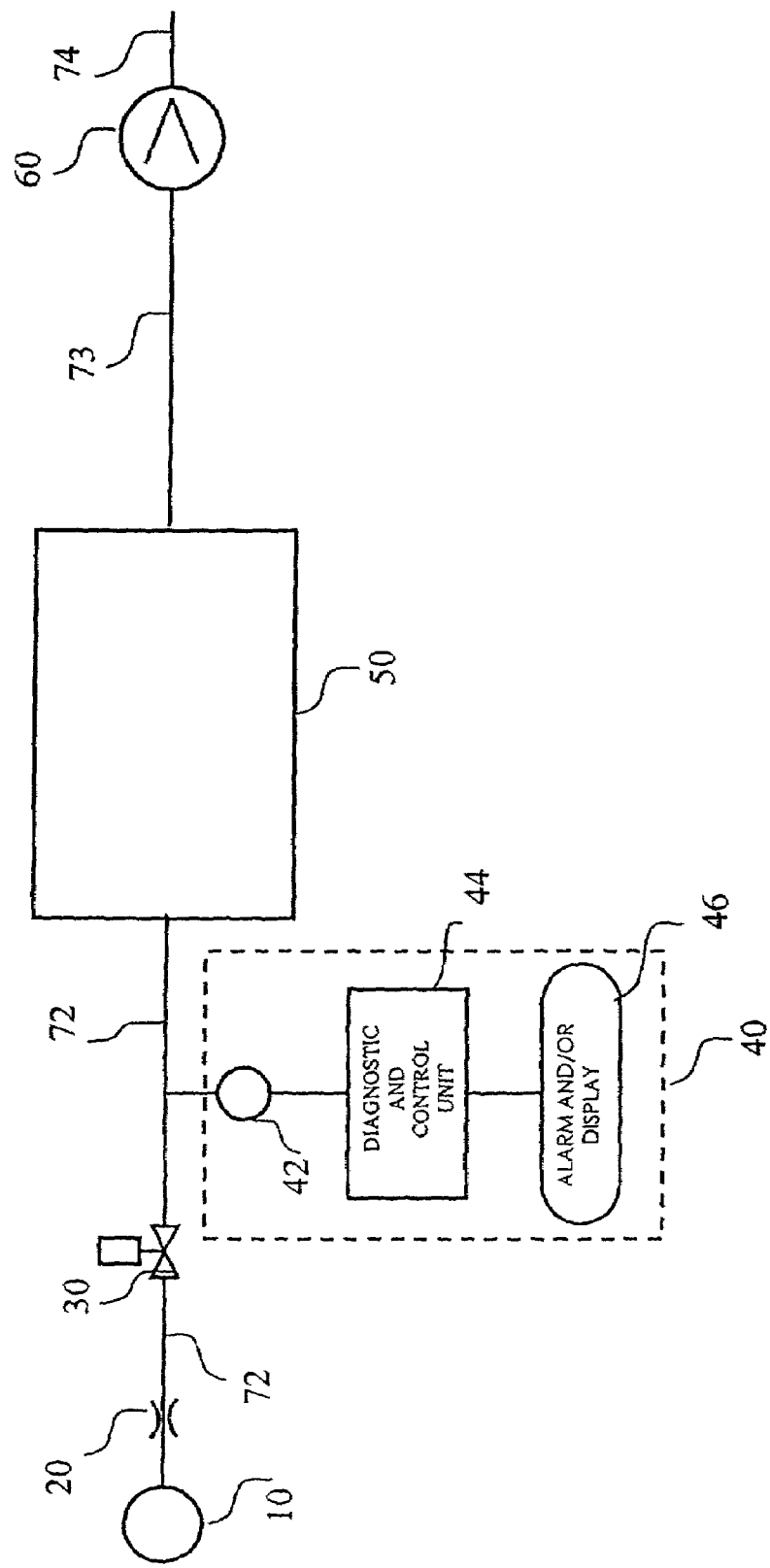
FIG. 1 is a schematic illustration of an apparatus for supplying repeated vapor phase reactant pulses to a reaction chamber according to a first embodiment of the present invention.

FIG. 1 is a schematic illustration of an apparatus for supplying repeated vapor phase reactant pulses to a reaction chamber according to a first embodiment of the present invention. The system as shown in FIG. 1 comprises a reactant source 10, connected through a reactant conduit 72 to a reaction chamber 50. The reactant can be present in the reactant source 10 as a compressed gas or as a vapor phase reactant in communication with a part of the reactant that is present in liquid or solid phase, provided that the vapor pressure of the reactant is sufficiently high to transport the reactant to the reaction chamber. Gases are removed from the reaction chamber 50 by a vacuum pump 60 via an outlet conduit 73 and exhausted through a pump exhaust 74. A reactant valve 30 is placed in the reactant conduit 72 to induce pulse-wise supply of the reactant to the reaction chamber 50 through repeated switching of the reactant valve 30. By repeated and reproducible switching of the reactant valve 30 a number of substantially identical reactant pulses are induced. A flow restrictor 20 may be placed in the reactant conduit 72 to limit the maximum flow of the reactant.

A pulse monitoring apparatus 40 is positioned in communication with the reactant conduit 72, between the reactant valve 30 and the reaction chamber 50. The illustrated pulse monitoring apparatus 40 comprises a sensor 42, a diagnostic and control unit 44 and an alarm or a display 46. The sensor 42 is configured to generate a signal as a function of time of a characteristic parameter of the reactant pulses in the reactant conduit 72. The diagnostic and control unit 44 receives this signal. The sensor 42 is preferably a pressure sensor but other sensors are also possible, such as, for example, a mass flow meter that is fast enough to be able to measure the pulse mass flow as a function of time, or any other sensor that is capable of measuring a characteristic parameter of the pulse as a function of time.

The diagnostic and control unit 44 generally comprises a general purpose computer or workstation having a general purpose processor and a memory for storing a computer program that can be configured for performing the steps and functions described below. Part of the memory may be used for storing measurement data collected by the diagnostic and control unit 44. In the alternative, the unit may comprise a hard wired feedback control circuit, a dedicated processor or any other control device that can be constructed for performing the steps and functions described below.

The diagnostic and control unit 44 is preferably operatively connected to the alarm and/or display device 46, as shown, which may comprise a display unit for displaying information gathered by the diagnostic and control unit 44.

During operation of the apparatus as shown in FIG. 1, the sensor 42 produces a characteristic repeating pattern of the signal. This pattern can be recorded, stored and/or analyzed by the diagnostic and control unit 44 and used to determine if changes occur in the supply of pulses to the reaction chamber. For example, a pressure curve (see, for example, FIG. 5 and the attending description) can be displayed graphically on the display unit 46. An operator of the apparatus can use the display unit 46 to recognize the characteristic repeating pattern of the pressure curve. To aid the operator in analyzing the pressure curve, the diagnostic and control unit 44 preferably includes a store and display ability such that data accumulated at different times can be compared. For example, data recorded just after the reactant source 10 has been installed can be visually compared to data recorded after the reactant source has been in use for some time.

In a modified embodiment, the diagnostic and control unit 44 can include pattern recognition methodology software configured to characterize the shape of the pressure curve. Using such software, significant deviations from the characteristic shape of the pressure curve can be identified and quantified. If such a deviation occurs, an alarm can be activated. An example of such a pattern recognition methodology is the "typical shape function" methodology, which is described in U.S. Pat. No. 5,797,395 and the references identified therein, which are hereby incorporated by reference herein. Such a methodology can be applied over multiple pulsing series or over a single pulsing series.

In modified arrangements, the diagnostic and control unit 44 can be configured to calculate a characteristic parameter of a curve for a single pulse, such as the average value of the pressure, the peak value of the pressure, a particular (e.g., maximum or minimum) width of the curve and/or the area of the curve.

Figure 2:
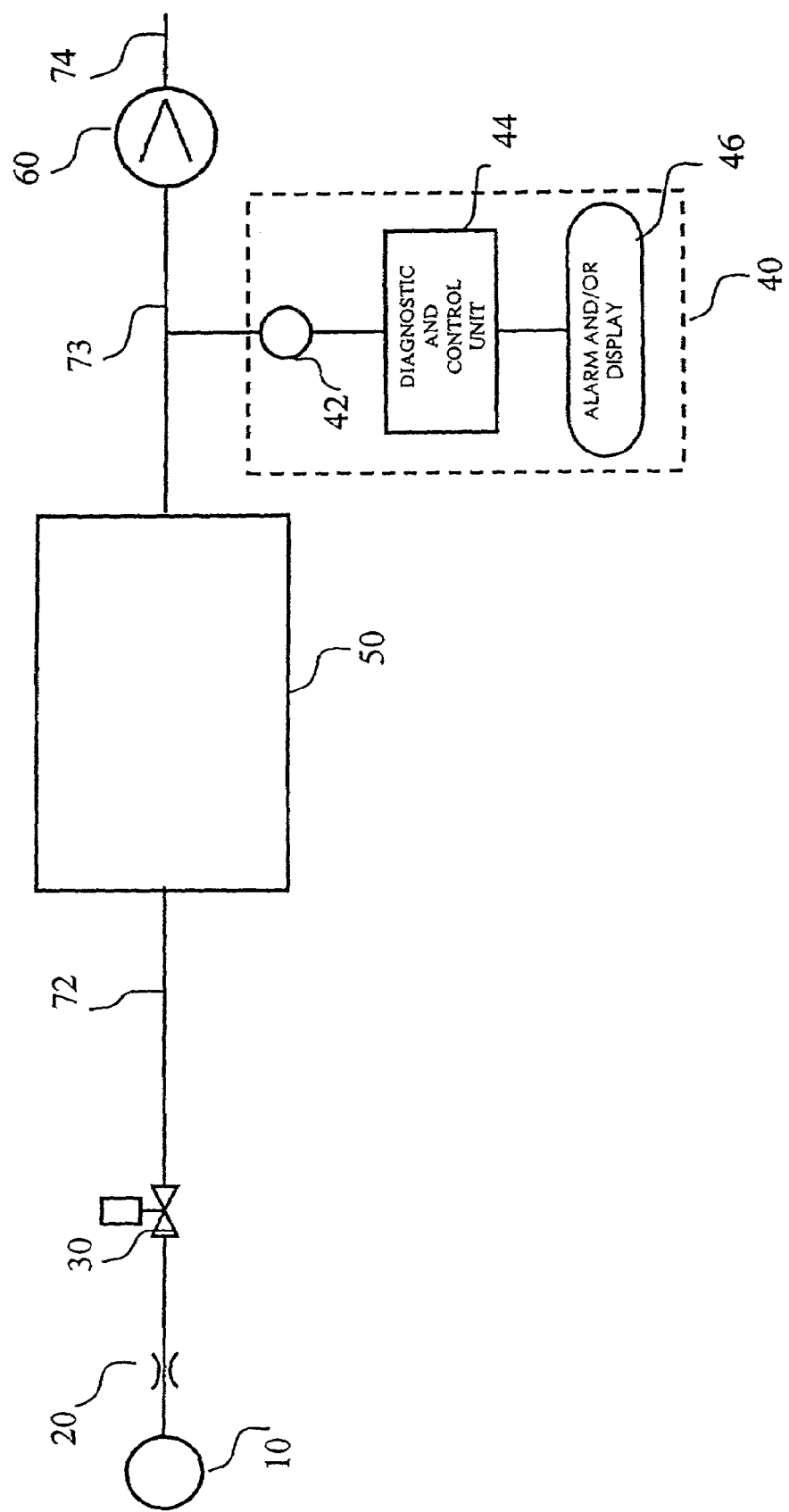
FIG. 2 is a schematic illustration of an apparatus for supplying repeated vapor phase reactant pulses to a reaction chamber according to a second embodiment of the present invention.

FIG. 2 shows a second embodiment of the present invention wherein similar components are indicated with like reference numbers as in FIG. 1. In FIG. 2, the sensor 42 is positioned in communication with the outlet conduit 73, which connects the reaction chamber 50 with the vacuum pump 60.

Figure 3:
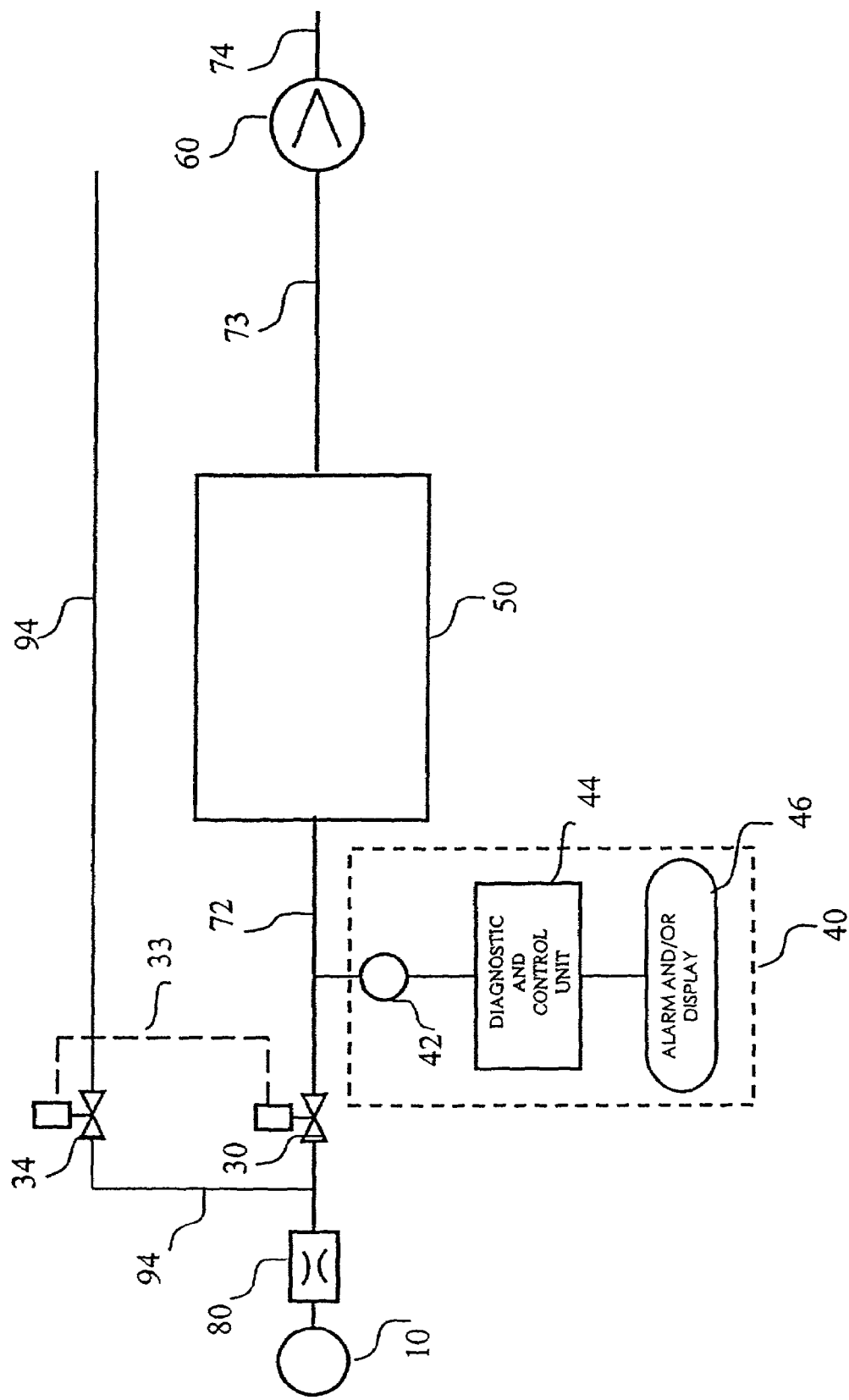
FIG. 3 is a schematic illustration of an apparatus for supplying repeated vapor phase reactant pulses to a reaction chamber according to a third embodiment of the present invention.

FIG. 3 shows a third embodiment of the present invention wherein similar components are indicated with like reference numbers as in FIG. 1. In the reactant conduit 72, which connects the reactant source 10 with the reaction chamber 50, a mass flow controller 80 is installed to create a substantially constant flow of reactant. A bypass conduit 94 is connected at one end to the reactant conduit 72 and at the other end to an exhaust (not shown). A bypass valve 34 is connected with the reactant valve 30, through a connection 33 such that the valves 30 and 34 are oppositely switched simultaneously. Consequently, when the reactant valve 30 is opened, the bypass valve 34 is closed, and when reactant valve 30 is closed, the bypass valve 34 is opened. The connection 33 can be operated mechanically, pneumatically or via a control loop.

Figure 4:
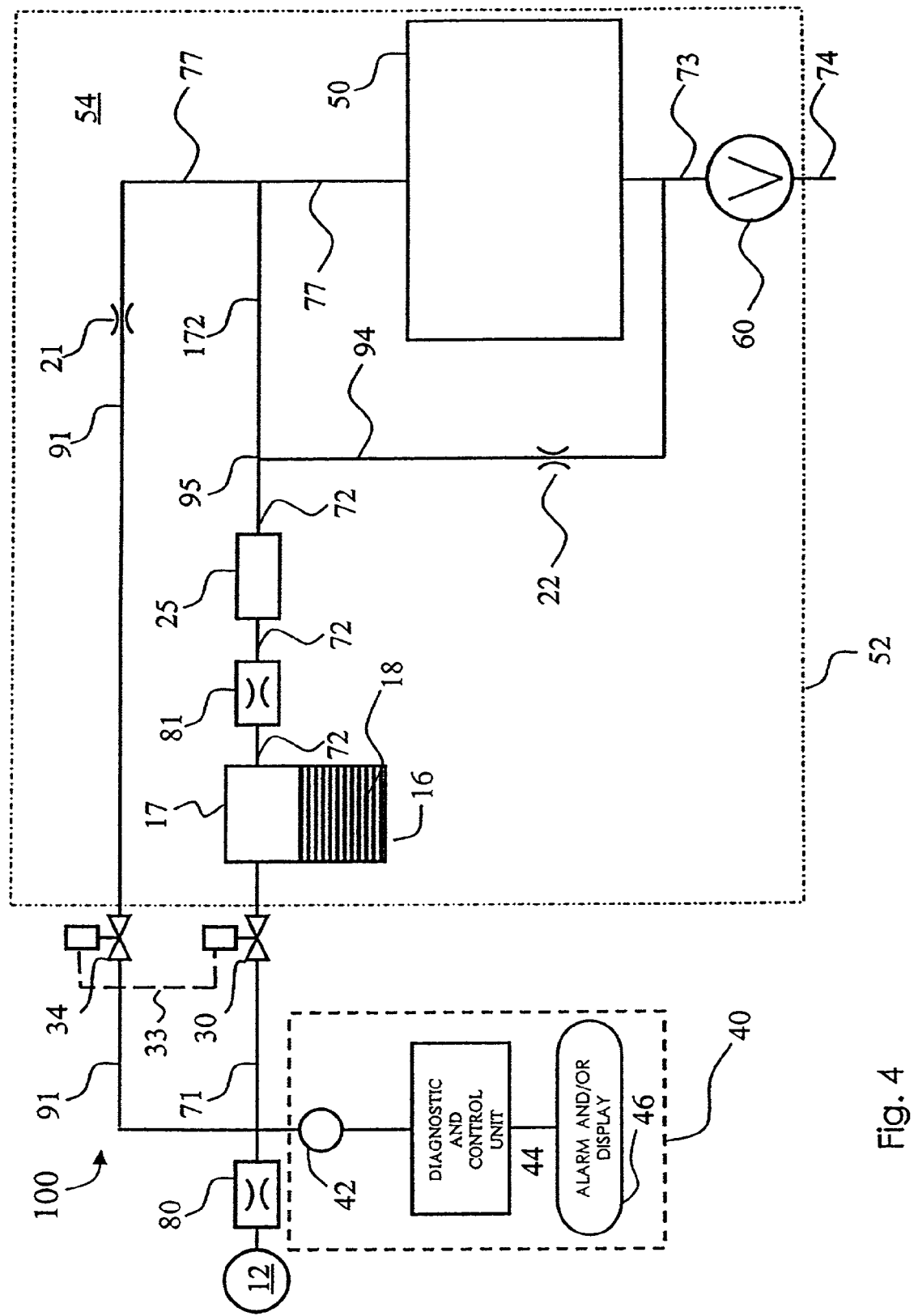
FIG. 4 is a schematic illustration of an apparatus for supplying repeated vapor phase reactant pulses to a reaction chamber according to a fourth embodiment of the present invention.

The invention will now be illustrated by two further examples, which relate to liquid or solid reactant sources and employing a carrier gas to transport the reactant from the reactant source to the reaction chamber. FIG. 4 is a schematic illustration of an ALD system 100 having certain features and advantages according to the present invention. The ALD system includes the pulse monitoring apparatus 40, which can be used to monitor the curve shape of repeated reactant pulses and to detect if changes in the curve shape occur. The pulse monitoring apparatus 40 is described in the context of an ALD reactor because the pulse monitoring apparatus has particular utility in this context. However, certain features, aspects and advantages of the pulse monitoring apparatus 40 described herein may find utility with other types of industrial chemical processes, such as, but not limited to chemical vapor deposition.

As shown in FIG. 4, the illustrated ALD system 100 comprises an inactive gas source 12, a reactant source 16 and a reaction chamber 50 in which a substrate (not shown) can be positioned. In a more typical ALD system, at least two sources of two mutually reactive reactants are provided and the substrate is subjected to alternating and repeated pulses of both reactants. However, for the purpose of illustrating the present embodiment, only one reactant source is indicated. The inactive gas source 12 provides an inactive gas to facilitate transport of the reactant to the reaction chamber 50 and to purge the reaction chamber 50. In the present context, "inactive gas" refers to a gas that is admitted into the reaction chamber and which does not react with a reactant or with the substrate. Examples of suitable inactive gases include, but are not limited to, nitrogen gas and noble gases (e.g., argon). As is well known in the art of ALD processing, purging of the reaction chamber involves feeding an inactive gas into the reaction chamber 50 between two sequential and alternating vapor-phase pulses of the reactants from the reactant source 16 and a second reactant source, not shown. The purging is carried out in order to reduce the concentration of the residues of the previous vapor-phase pulse before the next pulse of the other reactant is introduced into the reaction chamber 50. In other arrangements, the chamber can be evacuated between reactant pulses.

In the illustrated arrangement, the same inactive gas, from a single source, is used as carrier gas and as purge gas. In alternative embodiments two separate sources can be used, one for carrier gas and one for purge gas. As will be explained below, the purging gas can also be used for providing a gas barrier against the flow of reactant residues into the reaction chamber 50 during the purging of the reaction chamber 50.

The illustrated reactant source 16 includes a container 17 or similar vessel, which is capable of containing solid and/or a liquid reactant material 18 and in which the reactant material 18 can be vaporized. It is generally provided with an inlet nozzle (not shown), which is connected to a carrier gas supply conduit 71 for introduction of a carrier gas into the container 17 from the inactive gas source 12. The container 17 is also provided with an outlet nozzle (not shown), which is connected to the reactant conduit 72, which interconnects the reactant source 16 with the reaction chamber 50 through an inlet conduit 77. The reactant source 16 can be equipped with a heater (not shown) for vaporizing the reactant material 18. Alternatively, feeding heated carrier gas into the reactant source 16 can carry out heating. One embodiment of a reactant source container is described in co-pending U.S. patent application Ser. No. 09/854,706, filed May 14, 2001, the entire contents of which are hereby incorporated by reference herein.

The inactive gas source 12 is also connected to the reaction chamber 50 through a purge conduit 91, which is connected to an inlet conduit 77 of the reaction chamber 50.

The outlet conduit 73 is connected to the reaction chamber 50 for removing unreacted vapor-phase reactants and reaction by-products from the reaction chamber 50. The outlet conduit 73 is preferably connected to the evacuation pump 60. The exhaust conduit 74 is connected to the outlet of the vacuum pump 60.

The illustrated ALD system 100 includes a bypass conduit 94, with a first end connected to the reactant conduit 72 at a point 95 between the reactant gas source 16 and the inlet conduit 77 and a second end connected to the outlet conduit 73. In a modified arrangement, the bypass conduit 94 can be connected directly to the evacuation pump 60 or to a separate evacuation pump.

In the illustrated arrangement, the conduits described above are preferably formed from inert material, such as, for example, an inert metal, ceramic material or glass.

With continued reference to FIG. 4, the mass flow controller 80 and the reactant valve 30 are positioned along the carrier gas supply conduit 71. The purging conduit 91 preferably also includes a shut-off valve 34, which in this embodiment will be referred to as the purging valve 34. As will be explained below, the reactant valve 30 and the purging valve 34 can be used to alternately direct the carrier gas to the reactant source 16 and to the purging conduit 91. For this purpose, the reactant valve 30 and the purging valve 34 are preferably connected by a connection 33, such that the valves 30 and 34 are oppositely switched simultaneously. Consequently, when the reactant valve 30 is opened, the purging valve 34 is closed, and when the reactant valve 30 is closed, the purging valve 34 is opened. The connection 33 can be operated mechanically, pneumatically or via a control loop.

Preferably, flow restrictors 21 and 22 are positioned in the purging conduit 91 and the bypass conduit 94, respectively. The flow restrictors 21 and 22 reduce the cross-sectional area of the conduits 91 and 94 and direct the reactant from the reactant source 16 to the reaction chamber 50, rather than into the purging and bypass conduits 91 and 94, during a reactant pulse.

The dashed line 52 indicates a hot zone 54 within the ALD system 100. Preferably, the temperature within the hot zone 54 is kept at or above the evaporation temperature of the reactant material 18 and preferably below the thermal decomposition temperature of the reactants. Depending upon the reactant, typically the temperature within the hot zone 54 is in the range of about 25 to 500 degrees Celsius. The pressure in the reaction chamber 50 and in the conduits 71, 72, 77, 91, 94 that communicate with the reaction chamber 50 can be atmospheric but more typically the pressure is below atmospheric in the range of about 1 to 100 mbar absolute.

Preferably, the reactant and purging valves 30, 34 are positioned outside the hot zone 54. That is, within the hot zone 54 there are no valves that can completely close the conduits. The flow restrictors 21 and 22, however, can be positioned within the hot zone 54, as shown. Such an arrangement reduces the chances of condensation within the hot zone 54.

According to the illustrated arrangement, the bypass conduit 94 is not closed by a valve during the pulsing of reactants from the reactant source 16. As such, during a reactant pulse, a small fraction of the flow of reactant from the reactant source 16 flows into the bypass conduit 94 and into the evacuation pump 60. As such, the flow restrictor 22 in bypass conduit 94 is preferably sized such that the flow through the bypass conduit 94 is less than about one fifth of that in the reactant conduit 72. More preferably, the flow in the bypass conduit 94 is less than about 15%, and most preferably lest than about 10% of than the flow in the reactant conduit 72.

With continued reference to FIG. 4, the illustrated ALD system preferably also includes a purifier 25 for removing impurities, such as, for example, fine solid particles and liquid droplets from the reactant source 16. The separation of such impurities can be based on the size of the particles or molecules, the chemical character and/or the electrostatic charge of the impurities. In one embodiment, the purifier 25 comprises a filter or a molecular sieve. In other embodiments, the purifier 25 comprises an electrostatic filter or a chemical purifier comprising functional groups capable of reacting with specific chemical compounds present (e.g., water in precursor vapors). Preferably, the purifier 25 is positioned along the reactant conduit 72 between the reactant source 16 and the reaction chamber 50. More preferably, the purifier 25 is positioned along the reactant conduit 72 at a point between the reactant source 16 and the connection 95 with the bypass conduit 94. In this manner, the vapor flows in one direction only over the purifier 25 and the gas phase barrier is formed between the purifier 25 and the reaction chamber 50.

The ALD system 100 is preferably operated as follows. For a reactant pulse, the reactant valve 30 is opened while the purging valve 34 is closed. Inactive carrier gas flows through the reactant source 16 wherein the solid or liquid reactant 18 is vaporized such that a vapor exists in the container 17 above the solid or liquid reactant. Thus, reactant 18 from the reactant source 16 is carried in vapor form by the carrier gas through the reactant conduit 72 and the purifier 25 through the inlet conduit 77 into the reaction chamber 50. There is also a small flow of inactive carrier gas and reactant vapors into bypass conduit 94.

During a purging pulse, the reactant valve 30 is closed while the purging valve 34 is opened. Purging gas, therefore, flows first through the purging conduit 91 and then through the reaction chamber inlet conduit 77 into the reaction chamber 50. Moreover, a gas phase barrier is formed in a portion 172 of the reactant conduit 72 between the point 95 and the inlet conduit 77 as some of the purging gas flows into the reactant conduit 72 from the purging conduit 91 via inlet conduit 77. This purging gas also flows into the bypass conduit 94 and into the evacuation pump 60. As such, the flow direction of gas is reversed for the portion 172 of the reactant conduit 72 located between the inlet conduit 77 and the bypass conduit 94.

The reactant residues withdrawn via the bypass conduit 94 can be recycled. In such a modified arrangement, the bypass conduit 94 is connected to a condensation vessel maintained at a lower pressure and/or temperature in order to provide condensation of vaporized reactant residues.

The system 100 described above can be extended to include a second reactant source. In such an arrangement, a second reactant source can be positioned within a conduit system in a manner similar to that described above. Such an arrangement is described in co-pending U.S. patent application Ser. No. 09/835,931, filed Apr. 16, 2001, which is hereby incorporated by reference herein. Of course the ALD system 100 can also be expanded to more than two reactant sources in light of the disclosure herein.

As mentioned above, one problem associated with ALD systems such as the ALD system 100 described above and other chemical processes that use vaporized liquid and/or solid reactants is that it is difficult to determine how much solid and/or liquid reactant is left in the reactant container 17. The solid or liquid reactant may be highly flammable, explosive, corrosive and/or toxic. As such, the reactant container 17 is typically sealed during use. Conventional measuring devices positioned in the reactant container can be damaged and/or are impractical. As such, the chemical process is typically allowed to continue until the supply of liquid or solid reactant in the reactant container is exhausted. Operating in this manner is generally undesirable because it allows the concentration of the reactant in the reactor to drop below an ideal concentration range when the source is about to become depleted of the reactant. One solution is to calculate the rate of reactant removal from the reactant container. Based upon the calculation, the container can be changed before the reactant is exhausted. However, a safety margin is typically included in the calculation. This can result in unused precursor remaining in the container.

The various valves and conduits in the ALD system or chemical processing system can become damaged or worn out. This can result in contamination between the precursors thereby compromising the ALD or chemical process. Therefore, a need also exists for an improved method and apparatus for determining when the valves, conduits and connections in are worn out, damaged or clogged, preferably before the throughput of the reactor suffers from any malfunction of the source system.

As shown in FIG. 4, the illustrated system includes the pulse monitoring apparatus 40, which can be used to determine if the curve shape changes in the course of a plurality of reactant pulses. If this is the case, most likely the supply of reactant to the reaction chamber has changed. In this way any change in the system will be detected immediately, such as a low level of reactant in the reactant vessel, malfunctioning valves or conduits, so that prompt action can be taken without production losses due to poor process performance. The pulse monitoring apparatus 40 comprises a pressure sensor 42, which is preferably in communication with the carrier gas supply conduit 71 at a position upstream of the reactant valve 30. Although in this way reactant pulses are measured less directly than when the sensor is mounted, e.g., downstream of the reactant valve 30, it has the advantage that the sensor 42 is not exposed to the reactant material 18.

The pressure sensor 42 generates signal that is indicative of a characteristic parameter of the pulse, such as, pressure, within the carrier gas conduit 71. This signal is received by a diagnostic and control unit 44, which is operatively connected to the pressure sensor 42. As mentioned above, the diagnostic control unit 44 generally comprises a general purpose computer or workstation having a general purpose processor and the memory for storing a computer program that can be configured for performing the steps and functions described below. In the alternative, the unit can comprise a hard wired feed back control circuit, a dedicated processor or any other control device that can be constructed for performing the steps and functions described below.

The diagnostic and control unit 44 is preferably is operatively connected to an alarm and/or display device, which can comprise a display unit for displaying information gathered by the diagnostic and control unit 44.

Figure 5:
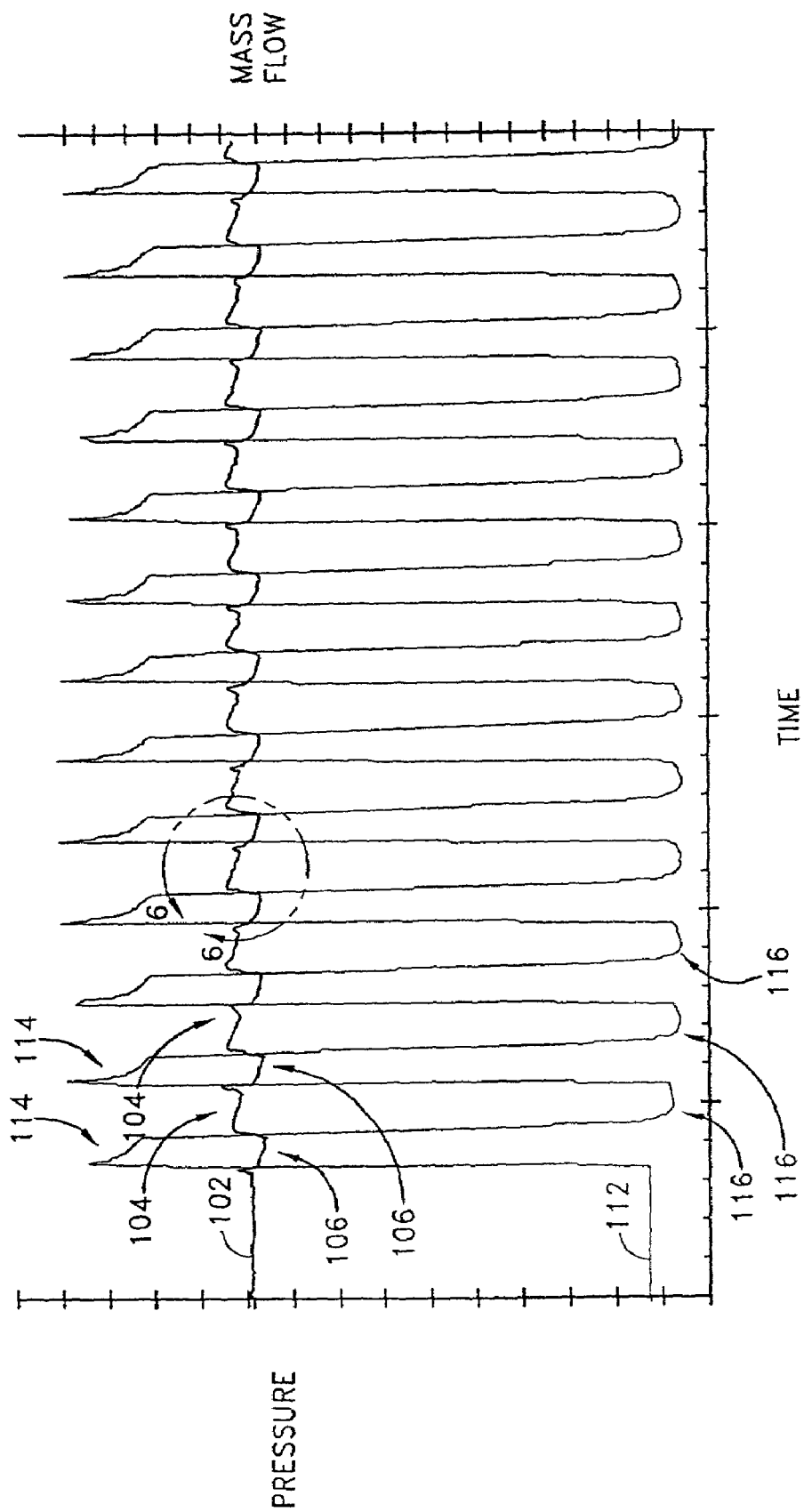
FIG. 5 is a pressure-time graph also showing a mass flow curve, illustrating pressure and mass flow fluctuations in a solid or liquid source container during a cyclic ALD process.
Figure 6:
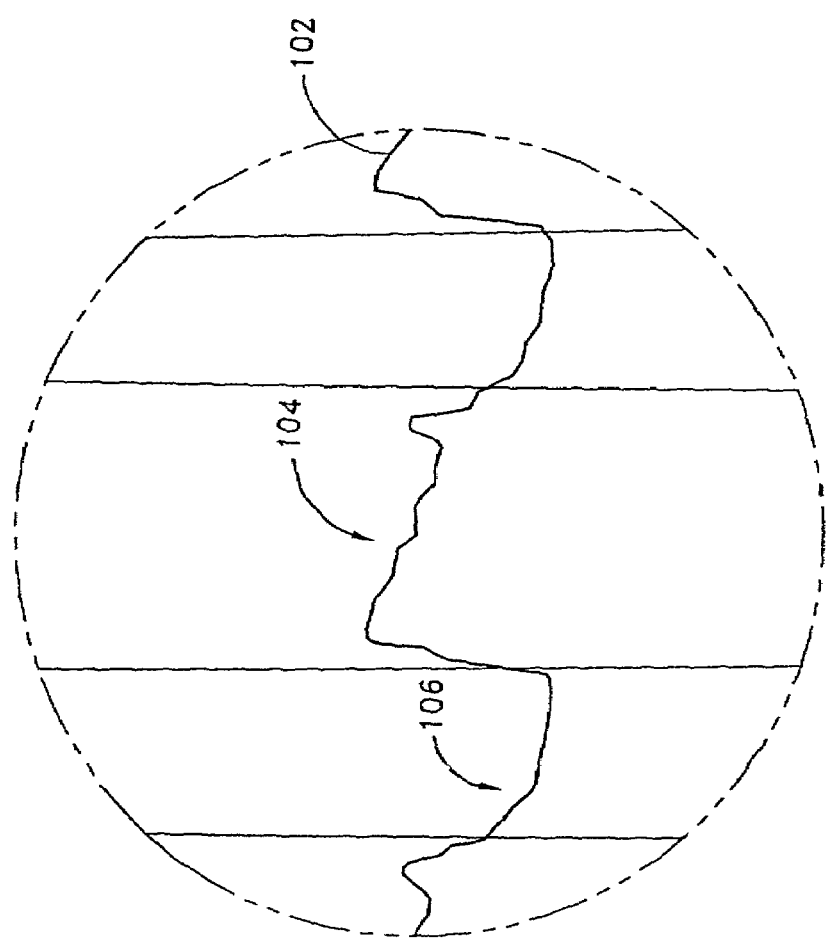
FIG. 6 is close up view identifying shape characteristics circled in the pressure flow curve of FIG. 5.

An embodiment of a process for determining the amount of liquid and/or solid phase reactant 18 in the reactant source 16 will now be described with particular reference to FIGS. 5 and 6 and to the equipment of FIG. 4. FIG. 5 includes a pressure curve 102, which indicates the pressure as a function of time in the carrier gas conduit 71 as indicated by the pressure sensor 42 (FIG. 4). FIG. 5 also includes a mass flow curve 112, which indicates the mass flow as a function of time through the reactant conduit 72 as indicated by a mass flow meter 81 (FIG. 4) that can be inserted into reactant conduit 72 upstream of the purifier 25. Such a mass flow meter 81 is typically not inserted into the ALD system 100 during normal operations but is instead preferably used only for experimental or diagnostic purposes.

During a reactant pulse, the reactant valve 30 is opened while the purging valve 34 is closed. As such, carrier gas flows through the carrier gas conduit 71 into the reactant source 16. This causes the mass flow as indicated by the mass flow meter 81 to rise, as indicated by the reoccurring peaks 114 in the mass flow curve 112. Correspondingly, the pressure tends to decrease as the carrier fluid is allowed to flow into the reactant source 16, which has a significant volume and is connected to the reaction chamber 50 through conduits with a relatively high conductance (i.e., relatively few flow restrictions). This decrease in pressure is indicated by the reoccurring valleys 106 in the pressure curve 102.

During a purging pulse, the reactant valve 30 is closed while the purging valve 34 is opened. Purging gas, therefore, flows through the purging conduit 91 into the reaction chamber 50 through the reaction chamber inlet conduit 77. The reactant valve 30 prevents carrier gas from flowing from the carrier gas source 12 into the reactant source 16. As such, as shown in FIG. 5, the mass flow as indicated by the mass flow meter 81 decreases, as indicated by the reoccurring valleys 116 in the mass flow curve 112. Moreover, because the carrier gas can only flow through the purge conduit 91, which has a relatively low conductance (i.e., a relatively large amount of flow restrictions) due the presence of the flow restrictor 21, the pressure as indicated by the pressure sensor 42 increases, as illustrated by the reoccurring peaks 104 in the pressure curve 102.

As such, during the operation of the ALD system 100, the pressure curve 102 produces a characteristic repeating pattern as shown in FIG. 5 for the reactant and purging pulses. This pattern can be recorded, stored and/or analyzed by the diagnostic and control unit 44 and used to determine when the amount of reactant 18 in the reactant source 16 is low and/or a valve or conduit of the ALD system is damaged or if any other significant change in the system has occurred. For example, the pressure curve 102 can be displayed graphically on the display unit 46. An operator of the ALD system 100 can use the display unit 46 to recognize the characteristic repeating pattern of the pressure curve 102. In particular, the operator can recognize the characteristic shape of the valleys 106 of the pressure curve 102 for one or more reactant and/or purging pulses. For example, deviations from the established pattern would indicate a low level of reactant and/or a damaged valve and/or conduit. To aid the operator in analyzing the pressure curve 102, the diagnostic and control unit 44 preferably includes a store and display ability such that data accumulated at different times can be compared. For example, data recorded just after the reactant source 16 has been installed can be visually compared to data recorded after the ALD system 100 has been operating for some time.

In a modified embodiment, the diagnostic and control unit 44 can include pattern recognition methodology software configured to characterize the shape of the pressure curve 102 over one or more purging and/or reactant pulses. Using such software, significant deviations from the characteristic shape of the pressure curve 102 can be identified and quantified. If such a deviation occurs, an alarm can be activated. Note that the data can also be manipulated (e.g., summed or integrated over one or a predetermined number of sequential pulses, etc.) prior to comparison in a manner to accentuate any deviations.

In a modified arrangement, the diagnostic and control unit 44 can be configured to calculate the average pressure in the carrier gas conduit 71 during one or more reactant and/or purging pulses. In general, as the reactant in the reactant source is depleted, the average pressure in the carrier gas conduit 71 decreases because there is less resistance to the flow of carrier gas through the reactant container 17. In such an arrangement, the diagnostic and control unit can be configured to indicate that the reactant container 17 needs to be changed when the average pressure during a reactant pulse (or during a predefined number of sequential pulses) drops below a predetermined value.

Figure 7:
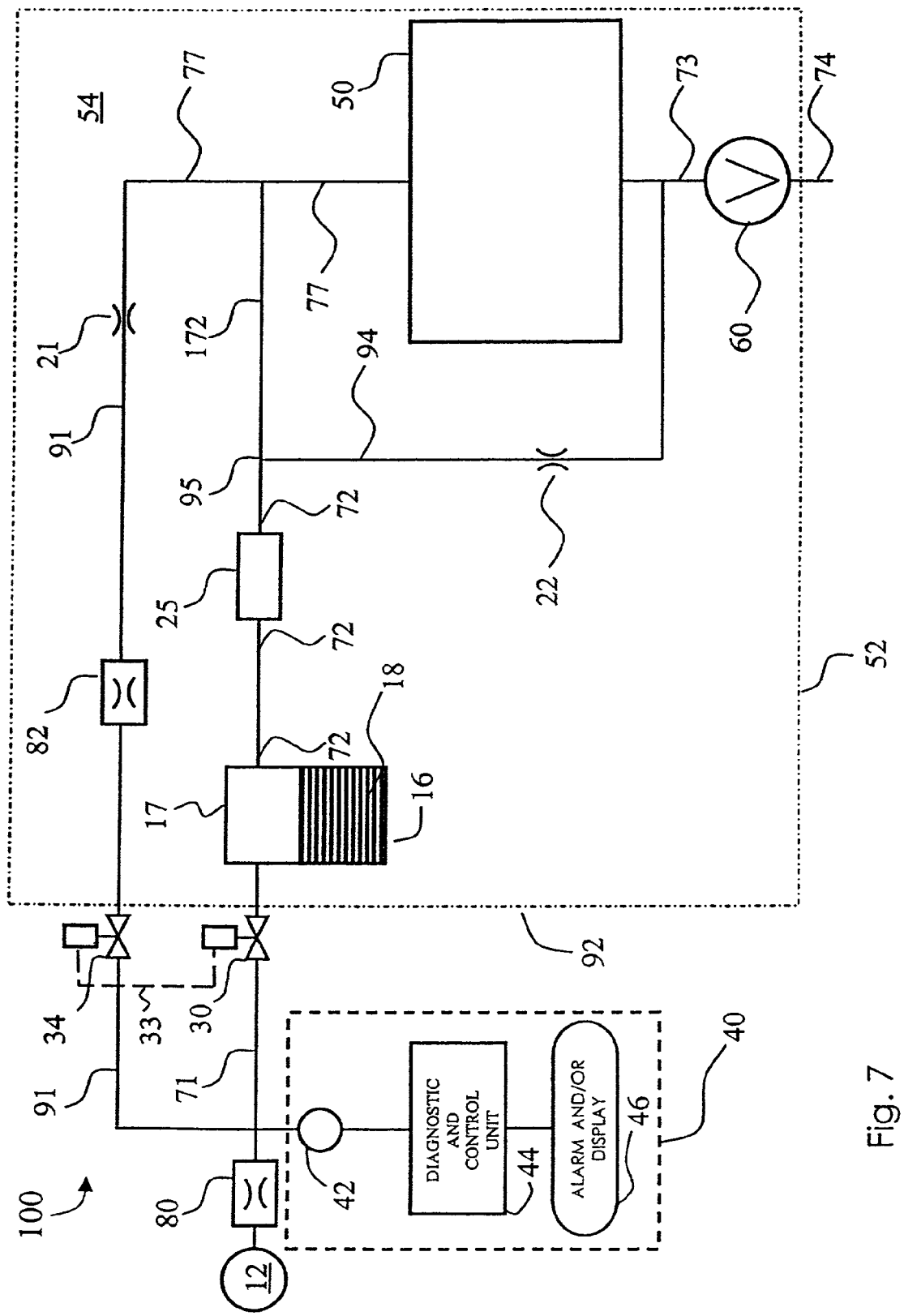
FIG. 7 is a schematic illustration of another apparatus for growing thin films onto the surface of a substrate having certain features and advantages according to another embodiment of the present invention.

FIG. 7 illustrates another modified arrangement of a simplified ALD apparatus 100 wherein like numbers are used to refer to parts similar to those of FIG. 4. As with the previous arrangement, the pulse monitoring apparatus 40 includes a pressure sensor 42, preferably located upstream of reactant valve 30, a diagnostic control unit 44 and an alarm and/or display device 46. The pulse monitoring apparatus 40 includes a mass flow meter 82, which is preferably positioned along the purge conduit 91. This position of the mass flow meter 82 is preferred because a mass flow meter typically represents a large flow restriction. Placing a large such flow restriction downstream of the reactant source is generally undesirable because the resultant pressure drop across the mass flow meter can cause undesirable condensation of the reactant.

Figure 8:
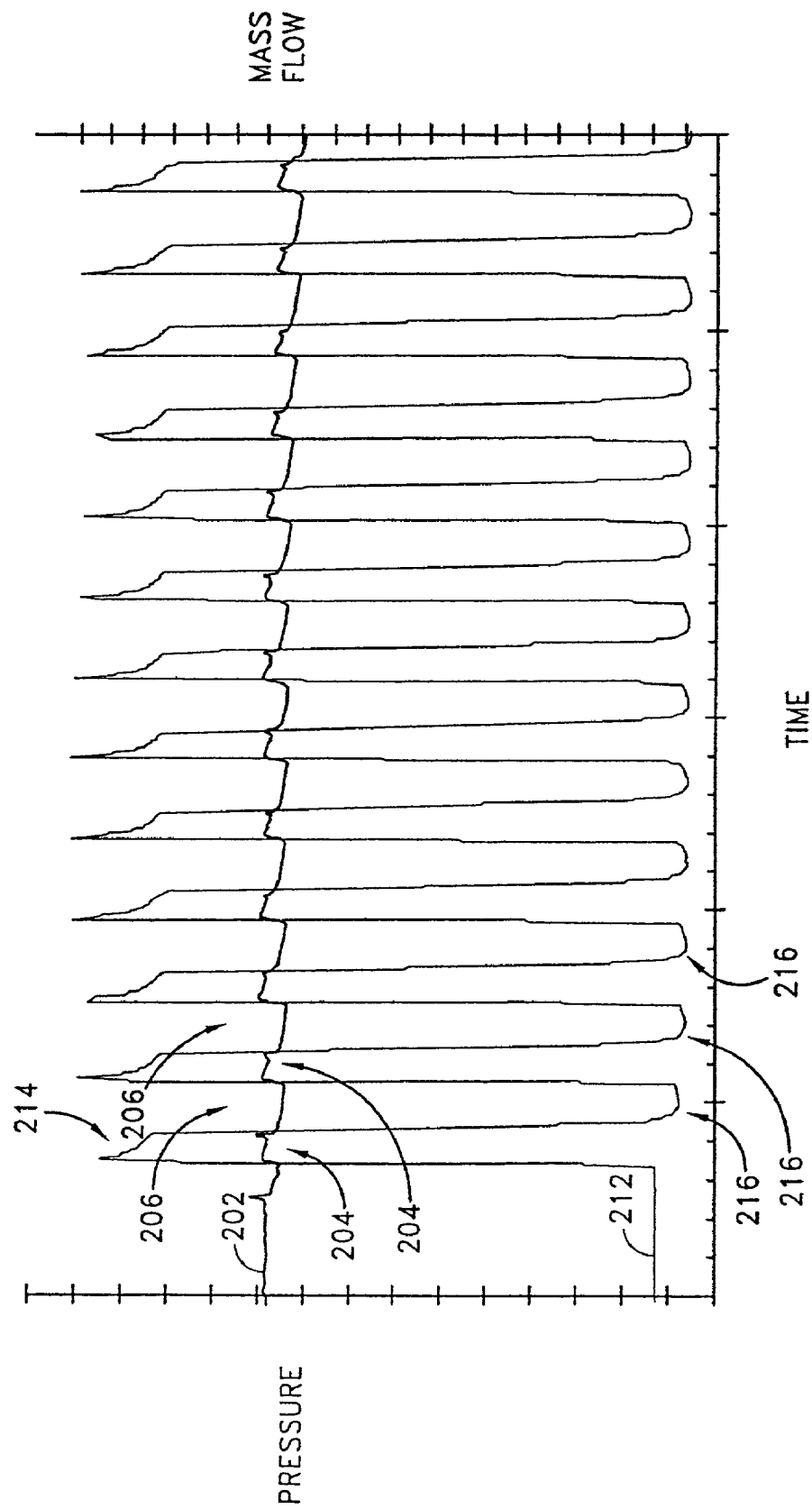
FIG. 8 is another pressure-time graph also showing a mass flow curve, illustrating pressure and mass flow fluctuations in a solid or liquid source container during a cyclic ALD process.

FIG. 8 illustrates a pressure curve and mass flow curve, which can be generated by the diagnostic and control unit 44. The reference numbers 202 and 212 represent the pressure and the mass flow curves, respectively, during a series of reactant and purging pulses, as measured by the pressure sensor 42 (FIG. 7) and the mass flow meter 82 (FIG. 7). As compared to FIG. 5, the mass flow curve 212 is horizontally "shifted" with respect to the pressure curve 202. That is, during reactant pulses, the mass flow through the purge conduit 91 is small. In contrast, during purging pulses, the mass flow through the purge conduit 91 is large. Accordingly, valleys 206 in the pressure curve 202 correspond to valleys 216 in the mass flow curve 212 (both representing reactant pulses) and peaks 204 in the pressure curve 202 correspond to peaks 214 in the mass flow curve 212 (both representing purging pulses).

In this arrangement, the diagnostic and control unit 44 is preferably configured to analyze the patterns of both the pressure curve 202 and the mass flow curve 212 during one or more purging and/or reactant pulses. Changes in the pattern of the pressure curve 202 indicate that the amount of reactant in the reactant container 17 is changing. If the pattern of the pressure curve 202 changes beyond a predetermined value, this indicates that it is time to change the reactant container 17. In contrast, if the pattern of both the mass flow curve 212 and the pressure curve 202 change beyond a predetermined value, this can indicate that either one of the valves (e.g., the pulsing valve 30) and/or one of the conduits is damaged.

Although the invention has been described in the context of ALD, with liquid and/or solid phase reactants, it will be understood that the invention is also applicable outside the context of ALD and is also applicable to gaseous reactant sources. In case of a gaseous reactant source a carrier gas might not be needed.

Further, the sensor to measure a characteristic parameter of the reactant pulse can be a sensor other than a pressure sensor, such as a concentration sensor, a mass flow sensor or any other sensor, including a Pirani gauge and a convection gauge, that is capable of characterizing the pulse(s) and is fast enough to be able to measure a characteristic parameter as a function of time with sufficient resolution.

A convection gauge is similar to the Pirani gauge, but measures the resistivity of a wire (e.g., a gold-plated tungsten wire) to detect the cooling effects of both conduction and convection, and thereby extends the sensing range as compared to the Pirani gauge. At higher vacuums, response depends on the thermal conductivity of the gas within which the wire is positioned, while at lower vacuums it depends on convective cooling by the gas molecules. The resistivity of the filament changes when the temperature of the filament changes. The thermal capacity from the filament depends on the pressure and thermal conductivity (or thermal capacity) of the surrounding gas atmosphere. As long as the concentration partial pressure) of the reactant is the same from one pulse to another, the shape of a current-time curve (for constant voltage) or voltage-time curve (for constant current) will be unchanged. When the source is about to become depleted, the partial pressure of the reactant decreases and the shape of the curve changes. The measurement range is typically from $10^{-3}$ Torr to 1,000 Torr. With the exception of its expanded range, features and limitations of this sensor are the same as those of Pirani and most thermocouple gauges. As the pulse repetition frequency is in the order of once per second, the time resolution of the sensor should be in the order of 1 millisecond or better. The sensor can also be installed at different locations, such as downstream of the reactant source or even downstream of the reaction chamber. Each process system will have various suitable locations to install a sensor for measuring a characteristic parameter of a reactant pulse, which will be clear to someone skilled in the art or can be determined by routine experimentation. Furthermore it is possible to install several sensors at more than one location in the system to obtain more complete information about the reactant supply.

In yet a further embodiment, a vibration pulse of a switching valve (e.g., valves 30 and 34) is recorded and monitored. A pulsing valve makes a characteristic vibration, such as within the sonic range, when it is operating properly. As the valve wears out over time, the sound changes. A microphone may be attached to the valve body and the sound is recorded. A spectral analysis of the sound and a comparison to previously recorded sound pulses allows one to monitor changes in the operation of the valve as a function of time. A filter can be applied to filter out a constant level of background sound or incidental background sound so that only the repeating sound pulse of the switching valve is passed by the filter and analyzed. A significant change in pulse sound could indicate that it is time to replace the switching valve. In a modified arrangement, instead of monitoring the sound of the valve, the vibrations of the valve can be monitored via a vibration or acceleration sensor. In another modified arrangement, the vibrations of the valve can be monitored with an acceleration or vibration sensor that creates a voltage output. These sensors can be micro-machined on silicon so they are quite small and sensitive. In a similar embodiment, the sound or other vibrations from a vacuum pump can be monitored over time with the purpose to detect changes as a function of time. The vacuum pump does not normally create sound pulses or vibration pulses but it has a continuous mode of operation and as such it differs from the pulse monitoring described above. Nevertheless, abnormalities can be detected in the form of changes over time in the curve of the parameter being monitored.

In the above-noted embodiments and modifications directed to determining when a solid or liquid source is becoming exhausted such as to effect the level of reactant in each pulse, the system can also be modified to extend the length of operation before recharging the reactant source without sacrificing the uniformity of reactant provided per pulse. Through routine experimentation, relationships can be established between changing patterns in the characteristic parameter(s) and the changing amount of reactant provided per pulse. Compensating changes in the reactant pulse duration, for example, can be correlated to the changes in the characteristic parameter(s). Accordingly, a feedback loop can be provided between the sensor and the control system for the valve pulsing such that, upon a detected change in the curve(s) in the characteristic parameter(s), the switching of the valve is changed such that the pulses provide an intended amount of reactant. As an example, when the curve height or the curve area tend to become smaller, the "open" time of the reactant valve can be increased such that the curve regains its original height or area.

It should be noted that certain objects and advantages of the invention have been described above for the purpose of describing the invention and the advantages achieved over the prior art. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Moreover, although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while a number of variations of the invention have been shown and described in detail, other modifications, which are within the scope of this invention, will be readily apparent to those of skill in the art based upon this disclosure. For example, it is contemplated that various combination or subcombinations of the specific features and aspects of the embodiments may be made and still fall within the scope of the invention. Accordingly, it should be understood that various features and aspects of the disclosed embodiments can be combined with or substituted for one another in order to form varying modes of the disclosed invention. Thus, it is intended that the scope of the present invention herein disclosed should not be limited by the particular disclosed embodiments described above, but should be determined only by a fair reading of the claims that follow.

We claim:

1. A method for determining changes in a reactant supply system that is designed to supply repeated pulses of a vapor phase reactant to a reaction chamber, the method comprising:

providing a reactant source;
providing a gas conduit system to connect the reactant source to the reaction chamber;
providing a valve positioned in the gas conduit system such that switching of the valve induces vapor phase reactant pulses from the reactant source to the reaction chamber;
repeatedly switching the valve to induce repeated vapor phase reactant pulses;
providing a first sensor that is in communication with the conduit system at a point upstream of the reaction chamber and downstream of the reactant source, the first sensor providing a first signal indicative of a first characteristic parameter of the reactant pulses as a function of time;
generating a first curve having a shape from the first signal for the repeated reactant pulses; and
monitoring the shape of the first curve to determine changes in the shape of the first curve over time, the changes in the shape of the first curve being indicative of changes in a supply of repeated reactant pulses to the reaction chamber.

2. The method as in claim 1, further comprising:
providing a second sensor that is in communication with the gas conduit system and provides a second signal indicative of a second characteristic parameter of the reactant pulse as a function of time;
generating a second curve having a shape from the second signal of the second sensor for repeated reactant pulses; and
monitoring the shape of the second curve derived from the second signal of the second sensor to determine changes in the shape of the second curve between subsequent reactant pulses, the changes in the shape of the second curve being indicative of changes in the supply of repeated reactant pulses to the reaction chamber.

3. The method as in claim 2, further comprising discriminating among:
a first condition, wherein the shape of the first curve changes significantly and the shape of the second curve remains substantially unchanged;
a second condition, wherein the shape of the second curve changes significantly and the shape of the first curve remains substantially unchanged; and
a third condition, wherein the shape of the first and second curves change significantly.

4. The method as claim 1, further comprising using pattern recognition methodology software to characterize the shape of said first curve and to determine if there are significant changes in the shape of the first curve over subsequent reactant pulses.

5. The method as in claim 1, further comprising generating an alarm signal when the shape of the first curve changes beyond a predetermined level.

6. The method as in claim 1, further comprising providing a feed-back control loop between the first sensor and the valve such that, upon a detected change in the shape of the first curve, the switching of the valve is changed such that a desired reactant mass per pulse is obtained.

7. The method as in claim 1, wherein providing a first sensor comprises providing a pressure sensor.

8. The method as in claim 1, wherein providing a reactant source comprises providing a liquid or solid phase reactant.

9. The method as in claim 8, further comprising providing a source of carrier gas that is connected to the reactant source through a carrier gas conduit.

10. The method as in claim 9, further comprising positioning the valve in the carrier gas conduit upstream of the reactant source and switching the valve induces carrier gas pulses from the carrier gas source to the reactant source.

11. The method as in claim 9, further comprising positioning the first sensor to measure a first characteristic parameter of the carrier gas pulse.

12. The method as in claim 1, wherein atomic layer deposition is conducted in the reaction chamber.

13. The method as in claim 1, wherein the first characteristic parameter comprises a vibration in a valve.

14. An apparatus for supplying repeated vapor phase reactant pulses to a reaction chamber, the apparatus comprising:
- a reactant source;
- a gas conduit system that connects the reactant source and the reaction chamber;
- a valve positioned in the gas conduit system such that switching of the valve induces vapor phase reactant pulses from the reactant source to the reaction chamber;
- a first sensor that is in communication with the gas conduit system at a position upstream of the reaction chamber and provides a first signal indicative of a first characteristic parameter of the reactant pulses at the position upstream of the reaction chamber as a function of time; and
- a diagnostic and control unit that is configured to generate a first curve from the first sensor and to monitor changes over time in a shape of the first curve during subsequent reactant pulses.

15. The apparatus as in claim 14, further comprising a second sensor that is in communication with the gas conduit system and provides a second signal indicative of a second characteristic parameter of the reactant pulses as a function of time, wherein the diagnostic and control unit is configured to generate a second curve from the second sensor and to monitor changes over time in a shape of the second curve during subsequent reactant pulses.

16. The apparatus as in claim 15, wherein the diagnostic and control unit is configured to discriminate among:
- a first condition, wherein the shape of the first curve changes significantly and the shape of the second curve remains substantially unchanged;
- a second condition, wherein the shape of the second curve significantly and the shape of the first curve remains substantially unchanged; and
- a third condition wherein the shapes of the first and second curves change significantly.

17. The apparatus as claim 14, wherein the diagnostic and control unit is configured to use pattern recognition methodology software to characterize the shape of the first curve and to determine if there are significant changes over time in the shape of the first curve during subsequent reactant pulses.

18. The apparatus as in claim 14, wherein the diagnostic and control unit includes an alarm and is configured to activate the alarm when the shape of the first curve changes beyond a predetermined level.

19. The apparatus as in claim 14, comprising a feed-back control loop between the first sensor and the valve, the feed-back control loop being configured such that, upon a detected change in the shape of the first curve, the switching of the valve is changed such that a desired reactant mass per pulse is obtained.

20. The apparatus as in claim 1, wherein the first sensor is a pressure sensor.

21. The apparatus as in claim 1, wherein the reactant source is a liquid or solid phase reactant.

22. The apparatus as in claim 21, comprising a source of carrier gas that is connected to the reactant source through a carrier gas conduit.

23. The apparatus as in claim 22, wherein the valve is positioned in the carrier gas conduit upstream of the reactant source such that switching the valve induces carrier gas pulses from the carrier gas source to the reactant source.

24. The apparatus as in claim 22, wherein the first sensor is positioned to measure a first characteristic parameter of the carrier gas pulses.

25. A method for determining changes in a reactant supply system that is designed to supply repeated pulses of a vapor phase reactant to a reaction chamber of an ALD system, the method comprising:
- providing a reactant source that comprises a solid and/or liquid reactant and a vaporizing mechanism;
- providing a conduit system to connect the reactant source to the reaction chamber and to connect a purging gas source to the reaction chamber;
- providing at least one valve positioned in the conduit system such that switching of the valve induces alternating vapor phase reactant pulses from the reactant source to the reaction chamber and purging pulses from the purging gas source;
- repeatedly switching the valve to induce repeated alternating vapor phase reactant and purging pulses;
- providing a first sensor that is in communication with the gas conduit system and provides a first signal indicative of a first parameter in the gas conduit system;
- generating a first curve from the first signal as a function of time, the first curve having a shape characteristic of the repeated vapor phase reactant and purging pulses while the reactant and purging pulses are being supplied to the reaction chamber;
- monitoring the shape of the first curve to determine changes indicative of changes in a supply of repeated reactant pulses to the reaction chamber; and
- in response to the changes in the shape of the first curve, replacing the reactant source with a second reactant source that comprises a solid and/or liquid reactant and a vaporizing mechanism.

26. The method as in claim 25, further comprising:
- providing a second sensor that is in communication with the conduit system and provides a second signal indicative of a second parameter;
- generating a second curve from the second signal as a function of time, the second curve having a shape characteristic of the repeated reactant and purging pulses; and
- monitoring the shape of the second curve to determine changes indicative of changes in the supply of repeated reactant pulses to the reaction chamber.

27. The method as in claim 26, wherein the first parameter is a pressure and the second parameter is a mass flow rate.

28. The method as in claim 27, further comprising discriminating among:
- a first condition, wherein the shape of the first curve changes significantly and the shape of the second curve remains substantially unchanged;
- a second condition, wherein the shape of the second curve changes significantly and the shape of the first curve remains substantially unchanged; and
- a third condition, wherein the shapes of the first and second curves change significantly.

29. The method as claim 25, further comprising using pattern recognition methodology software to characterize the shape of the first curve and to determine if there are significant changes in the shape of the first curve over time during subsequent reactant and purging pulses.

30. The method as in claim 29, further comprising generating an alarm signal when the shape of the first curve changes beyond a predetermined level.

31. The method as in claim 29, further comprising providing a feedback control loop between the first sensor and the valve such that, upon a detected change in the shape of the first curve, the switching of the valve is changed such that the shape of the first curve regains its original shape.

32. The method as in claim 25, wherein providing a first sensor comprises providing a pressure sensor.

33. The method as in claim 25, wherein the valve is positioned in the gas conduit system upstream of the reactant source and wherein switching the valve induces carrier gas pulses from a carrier gas source to the reactant source.

34. The method as in claim 33, further comprising positioning the first sensor to measure the pressure of the carrier gas pulse.

35. A method for determining changes in an amount of reactant in a first reactant source within an atomic layer deposition (ALD) system, the method comprising:
monitoring pressure in a conduit that communicates with a reactant source container in the ALD system;
generating a pressure signal corresponding to the monitored pressure during at least a first ALD cycle comprising a pulse of a first reactant and a pulse of a second reactant and at least a second ALD cycle separated in time from the first ALD cycle and comprising a pulse of the first reactant and a pulse of the second reactant;
comparing a pattern of the pressure signal over time during at least a portion of the first ALD cycle to a pattern of the pressure signal over time during at least a portion of the second ALD cycle; and
measuring if there is a significant difference in the pattern of the pressure signal between the first ALD cycle and the second ALD cycle to determine the amount of the first reactant in the first reactant source.

36. The method as in claim 35, wherein the reactant source container includes a vapor phase reactant and a non-vapor phase reactant that is in communication with the vapor phase reactant.

37. The method as in claim 35, further comprising determining if the non-vapor phase reactant in the reactant source container is depleted, at least in part, upon changes in the pattern of the pressure between the at least first and the at least second ALD cycles.

38. The method as in claim 35, further comprising determining if a valve or conduit in the ALD system is damaged or worn at least, at least in part, upon changes in the pattern of the pressure between the at least first and the at least second ALD cycles.

39. The method as in claim 35, further comprising monitoring a second characteristic parameter in a conduit of the ALD system and comparing a pattern of the second characteristic parameter during at least a first ALD cycle to a pattern of the second characteristic parameter during a second ALD cycle.

40. The method of claim 39, wherein the second characteristic parameter comprises a current or voltage signal of a convection sensor downstream of the reactant source container.

41. The method of claim 39, wherein the second characteristic parameter comprises vibrations measured at a valve repeatedly switching within the conduit.

42. The method of claim 41, wherein the vibrations comprise sounds.

* * * * *

UNITED STATES PATENT AND TRADEMARK OFFICE
CERTIFICATE OF CORRECTION

PATENT NO. : 7,063,981 B2  
APPLICATION NO. : 10/066169  
DATED : June 20, 2006  
INVENTOR(S) : Niklas Bondestam et al.

It is certified that error appears in the above-identified patent and that said Letters Patent is hereby corrected as shown below:

On Title Page item 75 delete "Bondestram," and insert --Bondestam,--, therefor.

Column 1, Line 54, delete "100409," and insert --100,409,--, therefor.

Column 2, Line 4, after "2001," insert --now U.S. Patent No. 6,368,633,--.

Column 2, Line 5, after "2001," insert --now U.S. Patent No. 6,783,590,--.

Column 3, Line 63, after "which" insert --:--.

Column 7, Line 1, after "2001," insert --now U.S. Patent No. 6,699,524,--.

Column 8, Line 64, after "2001," insert --now U.S. Patent No. 6,783,590,--.

Column 12, Line 23, delete "partial pressure)" and insert --(partial pressure)--, therfor.

Column 15, Line 50, in Claim 17, after "as" insert --in--.

Column 17, Line 1, in Claim 29, after "as" insert --in--.

Signed and Sealed this

Third Day of April, 2007

JON W. DUDAS  
*Director of the United States Patent and Trademark Office*